United States Patent [19]
Thornton et al.

[11] Patent Number: 5,766,981
[45] Date of Patent: Jun. 16, 1998

[54] THERMALLY PROCESSED, PHOSPHORUS- OR ARSENIC-CONTAINING SEMICONDUCTOR LASER WITH SELECTIVE IILD

[75] Inventors: Robert L. Thornton, East Palo Alto; Ross D. Bringans; G. A. Neville Connell, both of Cupertino; David W. Treat, San Jose; David P. Bour, Cupertino; Fernando A. Ponce, Sunnyvale; Noble M. Johnson, Menlo Park; Kevin J. Beernink, Mountain View, all of Calif.

[73] Assignee: Xerox Corporation, Stamford, Conn.

[21] Appl. No.: 368,676

[22] Filed: Jan. 4, 1995

[51] Int. Cl.$^6$ .................................................. H01L 21/20
[52] U.S. Cl. ........................... 438/36; 438/94; 438/559
[58] Field of Search ........................... 437/129, 133, 437/161; 148/33.1, 33.5, 33.6

[56] References Cited

U.S. PATENT DOCUMENTS

| | | | |
|---|---|---|---|
| 4,727,556 | 2/1988 | Burnham et al. | 372/50 |
| 4,824,798 | 4/1989 | Burnham et al. | 437/81 |
| 4,870,652 | 9/1989 | Thornton | 372/50 |
| 5,013,684 | 5/1991 | Epler et al. | 437/129 |
| 5,376,583 | 12/1994 | Northrup | 437/129 |
| 5,395,793 | 3/1995 | Charbonneau et al. | 637/129 |

OTHER PUBLICATIONS

D.G. Deppe et al., "Impurity–induced layer disordering of high gap InAlGaP heterostructures". Appl. Phys. Letts. 52(17) 1413–1415 (1988).

K.–Meehan et al., "Zn disordering of GaInP–AlgaInP quantum well heterostructure grown by metalorganic chemical vapor deposition". Appl. Phys. Lett. 54(21) 2136–2138 (1989).

Dong–Hoon Jang et al., "Zn induced layer disordering in GaInP/AlInP visible multi–quantum well distributed Bragg reflector laser diode", Jpn., Jour. Appl. Phys. 32(5b)L710–L712 (1993).

J.M. Dallasasse et al., "Impurity–induced layer disordering in InAlGap–InGaP quantum–well hetrostructures: visible spectrum buried heterostructure lasers", Jour. Appl. Phys. 66(2)482–487 (1989).

S. O'Brien et al., "Disordering intermixing and thermal stability of GaInP/AlInp superlattices and alloys", Appl. Phys. Lett. 53(19) 1859–1861 (1988).

R.L. Thornton et al., "Defect generation and suppression during the impurity–induced layer disordering of quantum sized GaAs/GaInP layers" Materials Research Society Symposium Proceedings 280, 445–448 (1993).

J.C. Knights, "Characterization of Plasma–Deposited Amorphous Si:H Thin Films", Proceedings of the 10th Conference on Solid State Devices, Tokyo 1978; Japanese Journal of Applied Physics. vol. 18 (1979) Suppl. 18–1, pp. 101–108.

M.J. Ludowise, "Metalorganic chemical vapor deposition of III–V semiconductors," J. App. Phys., 58 (8), 15 Oct. 1985, pp. R31–R55.

*Primary Examiner*—Chandra Chaudhari
*Attorney, Agent, or Firm*—Oliff & Berridge, PLC

[57] ABSTRACT

Methods for defect-free impurity-induced laser disordering (IILD) of AlGaInP and AlGaAs heterostructures. Phosphorus-doped or As-doped films are used in which silicon serves as a diffusion source and silicon nitride acts as a barrier for selective IILD. High-performance, index-guided $(AlGa)_{0.5}In_{0.5}P$ lasers may be fabricated with this technique, analogous to those made in the AlGaAs material system. The deposition of the diffusion source films preferably is carried out in a low pressure reactor. Also disclosed is a scheme for reducing or eliminating phosphorus overpressure during silicon diffusion into III-V semiconducting material by adding a pre-diffusion anneal step. Defects produced during intermixing are also reduced using a GaInP or GaInP/GaAs cap.

20 Claims, 2 Drawing Sheets

THERMALLY PROCESSED, PHOSPHORUS- OR ARSENIC-CONTAINING SEMICONDUCTOR LASER WITH SELECTIVE IILD

The U.S. Government has certain rights in the invention as provided by the terms of Advanced Technology Program Award 70NANB2H1241 awarded by the Department of Commerce.

RELATED APPLICATION

Commonly assigned U.S. patent application Ser. No. 08/345,108, filed Nov. 28, 1994, entitled "Index Guided Semiconductor Laser Diode with Shallow Selective IILD" (XRX-154).

This invention relates to AlGaInP or AlGaAs heterostructures especially adapted to function as semiconductor lasers.

BACKGROUND OF THE INVENTION

Selectively-buried ridge (SBR) waveguide structures have been used to achieve index guided AlGaInP lasers, but we believe that higher performance AlGaInP lasers are possible with the impurity-induced layer disordering (IILD) process, as shown in FIG. 1. The basic structure comprises a GaAs substrate 10 on which is epitaxially grown by known MBE or OMVPE processes a lower cladding layer 11 of AlGaInP, a thin sandwich of AlGaInP confining layers 12, 14 flanking a quantum well (QW) active layer 13 of GaInP, an upper cladding layer 15 of AlGaInP, and contact enhancing layers 16 typically of GaAs. Index-guiding regions 18, 19 formed by IILD flank a center striped region 20, and a p+ diffused region 21 blocks shunt currents via the disordered regions 18, 19. Contact metals 23 at top and bottom complete the structure. Compared to the SBR lasers, IILD can be used to realize lasers with narrower width (for lower threshold and a more circular beam), lower distributed loss (for higher efficiency), and stronger lateral index guiding (for less astigmatism). The process has been successfully realized in AlGaAs lasers.

The basic IILD process relies on the in-diffusion of an impurity (silicon, germanium, zinc, etc.) which promotes intermixing of atoms on the group-III sublattice [1]. Bracketed references are identified in the annexed Appendix. The layers comprising a heterostructure can thus be intermixed into a homogenous alloy whose composition is an average of the original layers. For example, a superlattice of 100 Å $Ga_{0.5}In_{0.5}P$/100 Å $Al_{0.5}In_{0.5}P$ will be intermixed to an alloy of $(Al_{0.5}Ga_{0.5}P)_{0.5}In_{0.5}P$. When a laser active region is intermixed with adjacent cladding layers in this manner, its refractive index is lowered. Consequently, a lateral waveguide can be formed by IILD. Similarly, the intermixed layers also have higher bandgap energy, resulting in the lateral confinement of injected carriers in a laser stripe. These attributes of IILD make it a superior technique for the fabrication of high performance index guided laser diodes.

The art of Si-diffusion based impurity induced disordering for the fabrication of optoelectronic devices in the AlGaAs system is well established. The Si diffusion technique relies on the deposition of a Si layer heavily doped with the column V element, in this case As, to facilitate Si in-diffusion and suppress As loss from the crystal surface.

U.S. Pat. No. 4,727,556, whose full contents are herein incorporated by reference, describes the fabrication of a laser diode by IILD, consisting of index-guiding wing regions flanking a striped emitting active region with said wing regions being of lower refractive index and higher bandgap to provide lateral optical and carrier confinement for the emitting striped regions. The process described provides a Si-doped source layer as a diffusion source of disordering impurities over a patterned $Si_3N_4$ mask where a laser element is desired. These films are deposited in an atmospheric pressure MOCVD reactor. Using Si, diffusion temperatures of 500°–900° C. are suggested in an As environment for the AlGaAs system. A cap layer of GaAs is used to reduce contact resistance. The patent also mentions applying the principles to other III-V systems, such as AlGaInP.

U.S. Pat. No. 4,824,798, whose full contents are herein incorporated by reference, describes improved methods for diffusion of the Si disordering impurity to avoid the need for an As overpressure yet avoid holes, cracks, bubbles or other irregularities or defects that may occur from time to time in the deposited layer or in the underlying semiconductor structure. The scheme proposed in this patent is to use as the impurity source a thin film bilayer comprising a lower layer of Si heavily doped (5–20% atomic weight) with As, P or Sb capped with an upper passivating layer of, for example, $Si_3N_4$ or $SiO_2$ in a thickness sufficient to prevent out diffusion of Ga and As for GaAs/GaAlAs quantum well (QW) structures.

In the annexed Appendix are listed other publications, whose contents are herein incorporated by reference, that describe other aspects of IILD as applied to GaInP/AlInP/AlGaInP systems. For example, in publication [4], the Si diffusion is carried out for 20 h at 850° C. in a sealed ampoule in a P overpressure. In publication [3], Zn was diffused as the disordering impurity at 650° C. for 5 min in an evacuated ampoule containing $Zn_3P_2$, GaP, and InP as diffusion sources.

We have attempted to apply the above-mentioned Si diffusion techniques to the InGaAlP material system, but have found that the presence of P as opposed to As on the column V sites will result in severe crystal defect formation if a Si:As film is used as a diffusion source. While a Si:P film can be substituted, it creates problems of P disposal in the conventional high temperature CVD method of depositing such films.

BRIEF SUMMARY OF THE INVENTION

An object of the invention is an improved process for fabricating buried heterostructure laser diodes in the AlGaAs or AlGaInP material system.

Another object of the invention is a process for fabricating high performance AlGaInP laser diodes by a process employing IILD.

In accordance with a first aspect of the present invention, to avoid the problems associated with P disposal, we employ a low temperature, plasma-enhanced chemical vapor-deposited (PECVD) Si film heavily doped with P as the diffusion source.

In accordance with a second aspect of the invention, where the deposition temperature for the diffusion source constituted by the Si-doped film exceeds the congruent sublimation temperature of the III-V material substrate, then the deposition must be conducted in an overpressure of P when P is to be included in the diffusion source or in an overpressure of As when As is to be included in the diffusion source. At temperatures below the congruent sublimation temperature, no overpressure is needed.

In accordance with a third aspect of the invention, to reduce the hydrogen content in the deposited film, which may result in bubbling and cracking of the film when elevated to a high temperature required for Si diffusion, we employ a pre-annealing step to drive hydrogen out of the film without morphology degradation.

A preferred embodiment of the process of the invention is the following sequence of process steps for the accomplishment of Si disordering in an InGaAlP based structure:

1. Low temperature PECVD of a heavily P doped amorphous silicon film, followed by low temperature PECVD of an amorphous silicon nitride film as a barrier film.
2. Medium temperature annealing of this film at a temperature sufficiently high that the hydrogen content of the film is substantially reduced, but sufficiently low such that the rate of hydrogen evolution is insufficient to cause cracking and bubbling of the silicon and silicon nitride films.
3. High temperature annealing of the III-V structure, either in a purely thermal manner or, for example, by a very high energy excimer laser, at a time and temperature or energy sufficient to cause Si diffusion into the InGaAlP crystal to the desired depth and concentration.

It may be desirable to provide for separate annealing cycles as in step 2 after the deposition of each of the two individual layers described in step 1.

Excimer laser irradiation may also be introduced prior to step 3 in order to enhance the Si incorporation into the desired layers.

In accordance with still another aspect of the present invention, improved AlGaAs buried heterostructures can be fabricated by a similar technique using As-doped silicon films.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

DETAILED DESCRIPTION OF PREFERRED EMBODIMENTS

Although silicon IILD is well developed in AlGaAs, it is not so well understood in $(AlGa)_{0.5}In_{0.5}P$. Despite AlGaInP heterostructures having been intermixed by zinc [2–4], silicon [5], and vacancy [6] diffusions, a high performance AlGaInP laser diode has not yet been realized through an intermixing process. Indeed, the first description of silicon IILD of AlGaInP laser diode heterostructures [5] exhibited a high density of crystalline defects, probably related to lattice mismatch, which led to very high thresholds and low efficiency. An important objective of the invention is an IILD process for AlGaInP which does not introduce defects and maintains lattice matched compositions.

We have found that a low temperature, low pressure, PECVD process is preferred for the deposition of As- or P-doped IILD source films. A preferred composition of the IILD source film is As- or P-doped Si, or As- or P-doped $Si_3N_4$. A temperature range of 200°–600° C. is preferred. The vapor sources can be $SiH_4$, $AsH_3$, and $PH_3$, at a pressure of 0.01–10 Torr, 1.0 Torr being preferred. Layer thicknesses are in the range of 100–2000 Å, with 800 Å preferred. Typical gas compositions can be a carrier gas such as Ar, $N_2$ or $H_2$, an active species containing Si, such as silane, and an active species containing P or As, such as phosphine or arsine. Preferably, the gas composition contains at least 0.1% of each of the active species, but it can be as high as 99+% of either of the active species. Flow rates can vary between 50–200 sccm.

When the film was As-doped $Si_3N_4$, we found during tests that the arsenic content of the films grown even in a low pressure organo-metallic vapor-phase epitaxy (OMVPE) reactor was equal to, or higher than, that grown in the more conventional high pressure (atmospheric pressure) reactor. In particular, the arsenic doping was higher than 20% up to as high as 32%, compared to about 7% for the films made in the more conventional reactor. The arsenic concentration was higher for higher $AsH_3$ flow during deposition. Likewise, the index of the deposited film also tends to increase with higher arsenic doping. Hence, while the low temperature low pressure PECVD reactor is preferred, it is within the scope of our invention to use a high-temperature low-pressure OMVPE reactor because of the higher doping content of the deposited source films.

There are several ways in which the process of the invention can be carried out. For AlGaAs diodes, the silicon:As diffusion source can be applied directly to the surfaces of a structure similar to that of FIG. 1 overlying the wing regions 18, 19 to be formed. For the fabrication of a laser array, with side-by-side individually-addressable diodes, a masking layer is first provided, and windows opened before deposition of the silicon:As layer. Preferably, a capping layer is provided over the Si:As layer.

Figure 1:
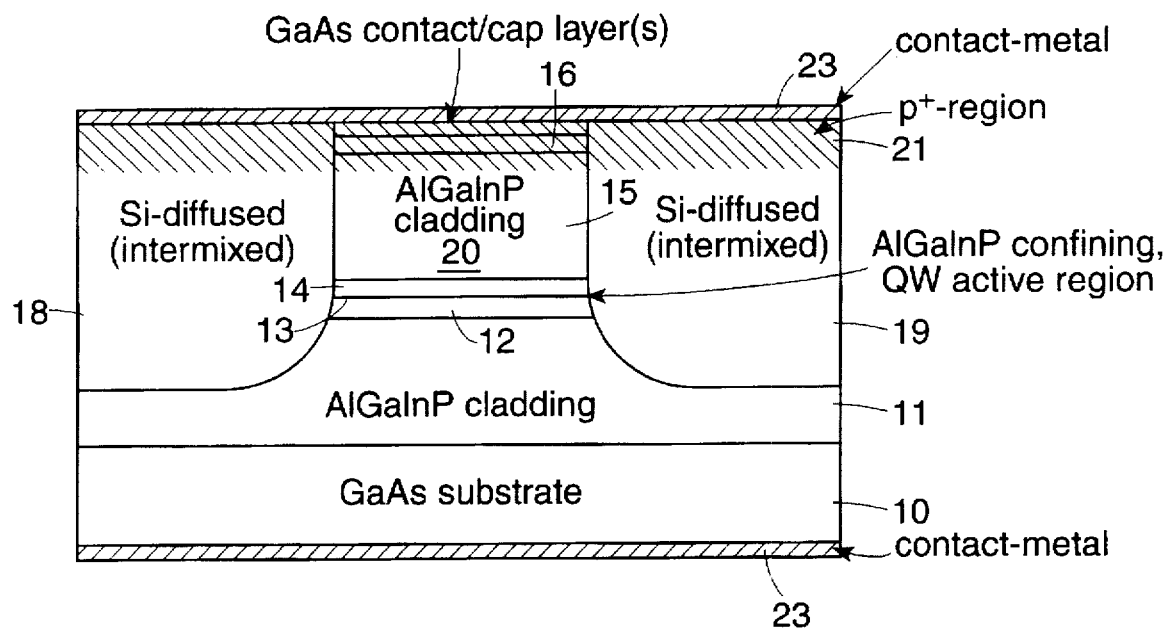
FIG. 1 is a cross-section of a desirable index-guided AlGaInP laser diode fabricated by IILD.

As an example of one method, a masking layer of $Si_3N_4$ doped with As was provided on a structure similar to that of FIG. 1 before formation of the diffused p+ region 21.

After deposition of the $Si_3N_4$:As, the film was patterned into 2 μm stripes on 4 μm centers. The Si:As diffusion source and a $Si_3N_4$:As capping layer were then deposited in a low-pressure reactor. Subsequently, the sample was annealed for 4 hours at 840° C. The resulting diodes demonstrated that the IILD capability for AlGaAs had been reproduced in a low pressure reactor. We also note that the arsenic concentration in these source and barrier films was considerably higher (32% arsenic in $Si_3N_4$) than the range disclosed in U.S. Pat. No. 4,727,556.

Subsequent experiments with $Si_3N_4$:P indicated that the phosphorus content was approximately 30% in the $Si_3N_4$ (and probably higher in the silicon source film, since the same $SiH_4$ and $PH_3$ flows for film deposition are used for both Si and $Si_3N_4$ but the growth rate is lower for Si because the $NH_3$ is not flowing). Again, this concentration is greater than the range prescribed in the earlier referenced '556 patent.

Subsequently, defect-free IILD was successfully performed on both AlGaAs and AlGaInP heterostructures, with phosphorus-doped source and barrier (capping) films.

We also found that the phosphorus-doped Si:P and $Si_3N_4$:P films worked well for IILD of an arsenide (AlGaAs/GaAs) superlattice. In this case, it was necessary to heat to the deposition temperature of 750° C. without any phosphorus overpressure (flowing phosphine during the heat-up results in conversion of the arsenide surface to a phosphide, thereby leading to surface defects during IILD). We also expect that heat-up in an $AsH_3$ ambient would also work well. In contrast, for the reverse case of arsenic-doped source and barrier films used to intermix AlGaInP layers, very high defect concentrations resulted in previous experiments. This is believed to be a consequence of the relatively low decomposition temperature of GaInP. At a temperature of 750° C., which is above the congruent sublimation temperature of GaInP, a group V overpressure is required to prevent decomposition of GaInP. However, using arsine in the atmospheric pressure reactor could lead to conversion of the GaInP to GaInAsP, accompanied by the creation of misfit dislocations.

Defects are likewise introduced when P-doped IILD films are deposited upon a GaInP surface heated without a $PH_3$ overpressure (however $|Al_{0.6}Ga_{0.4}|_{0.5}In_{0.5}P$ and AlInP can be heated to 750° C. in $H_2$, because their decomposition temperature is higher than that of GaInP). Thus, based on the low congruent sublimation temperature of GaInP compared to GaAs, it can now be understood why phosphorus-doped sources work well for IILD of AlGaAs layers, while arsenic-doped films lead to defects during IILD of AlGaInP layers. As long as the phosphide samples are first heated in $PH_3$, however, then the congruent sublimation temperature becomes irrelevant and IILD films can be deposited and annealed for defect-free, intermixed heterostructures, as previously demonstrated for AlGaAs. Although we have demonstrated defect-free IILD of AlGaInP only using P-doped films, we believe that As-doped films will also work, so long as the AlGaInP are first heated in a $PH_3$ ambient; then, when the silane is introduced inLo the reactor, it will be possible to replace the phosphine with arsine to produce an As- and Si-doped film.

Summarizing, our experments indicate that, in a low pressure deposition process for the IILD source film, when the deposition temperature is low, below the congruent sublimation temperature of the heterostructure superlattice, such as obtains in a PECVD reactor, then no phosphorus overpressure need be used during film deposition. However, under otherwise the same condition, when the deposition temperature is high, above the congruent sublimation temperature, such as obtains in an MOVCD reactor, then a phosphorus overpressure is needed.

Figure 2A:
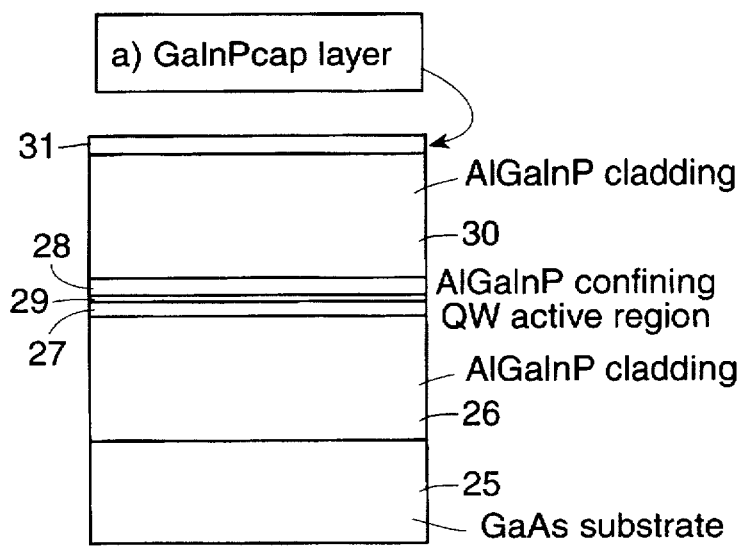
FIGS. 2A and 2B are cross-sections of improved AlGaInP laser diodes fabricated in accordance with the invention.

It was demonstrated previously [7] that intermixing of a GaAs layer into an AlGaInP layer will dislocate the structure. This is because the intermixing occurs more rapidly on the group-III sublattice, resulting in very large deviations from lattice match. This is especially a problem with respect to the GaAs cap layer which is typically included in AlGaInP structures for ohmic contacting. In accordance with a further aspect of our invention, we provide AlGaInP laser diode structures which can be intermixed to fabricate lasers. Examples of these are shown in FIGS. 2A and 2B.

The first structure is an all-phosphide laser, built on a GaAs substrate 25 by conventional epitaxial processes, comprising a lower cladding layer 26 of AlGaInP, AlGaInP confining layers 27,28 for a QW active region 29 of AlGaInP, and an upper AlGaInP cladding layer 30. The cap layer 31, in this case GaInP, is used to reduce the series resistance of the metal contact layers that are subsequently provided after IILD is carried out. As is conventional, all the semiconductive materials below the QW layer 29 are n-type, and all the layers above the QW layer 29 are p-type. The structure shown is a typical AlGaInP quantum well laser structure before IILD, but without a GaAs cap layer. As described above, the GaAs cap is excluded because it will cause severe dislocations upon intermixing. Although the contact resistance may be higher without the GaAs cap, the diode voltage is still tolerable, and is increased by less than one volt. To fabricate an IILD laser from this type of structure in an MOVCD, the phosphorus-doped silicon source and $Si_3N_4$ barrier films are deposited subsequent to heat-up in a $PH_3/H_2$ ambient overpressure.

Figure 2B:
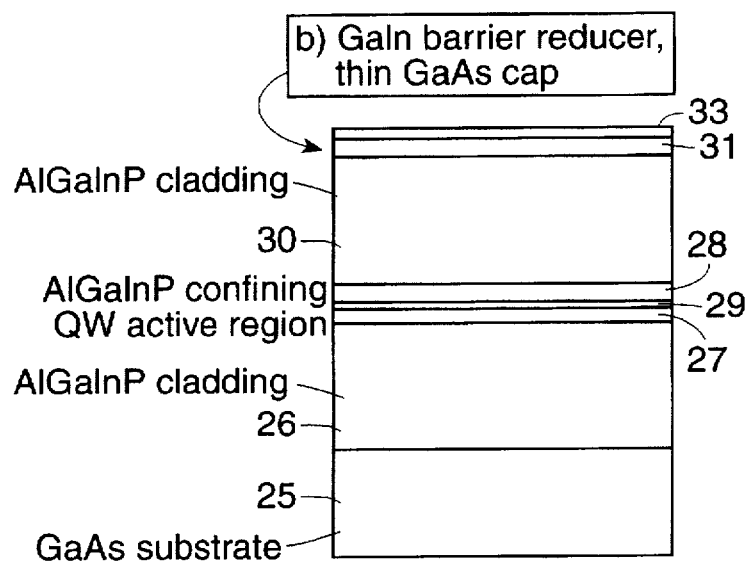

Alternatively, as shown in FIG. 2B, a very thin (<100 Å) GaAs cap layer 33 could be included, so long as its thickness is less than the critical value for misfit dislocation formation during IILD [8]. In this case, IILD could also be performed with the more common arsenic-doped Si and $Si_3N_4$ films; and the inclusion of a thin GaAs cap layer could permit a lower contact resistance.

One important difference between IILD in AlGaInP compared to AlGaAs is the diffusion rate, which is slower in AlGaInP. While an AlGaAs structure can be intermixed to a depth of about 1 μm in 4 hours at 850° C., an AlGaInP structure was intermixed to a depth of less than ½ μm in 24 hours at the same temperature. The stronger bond between phosphorus and group-III atoms, compared to the bond strength between arsenic and group-IIIs, is likely responsible for the slower rate of silicon diffusion in AlGaInP. Consequently, it is estimated that the typical AlGaInP IILD laser would require anneals in excess of 10 days at 840° C. To overcome the slow diffusion, two options may be employed: (1) shallow IILD laser structures which require <5000 Å intermixing depths [9]; and (2) IILD at higher temperatures.

Speeding-up the diffusion via option (2) through anneals at higher temperature is preferred, since improved performance is obtained with an index-guided, planar AlGaInP lasers having a deeper (1–1.5 μm) IILD. Our experiments have indicated that by annealing at 900° C. for 24 hours, silicon diffuses about 1.5 μm into the p-type AlGaInP representing the upper half of a visible laser diode structure. This is deep enough for IILD of a typical laser active region; however, growing material with thinner cladding layers, to minimize the IILD depth, is a further option.

Since the elevated temperature activates the diffusion process as expected, even higher temperature anneals (above 900° C.) will further accelerate the IILD, thereby allowing the AlGaInP laser IILD sequence to be shortened to 8 hours, typical of the AlGaAs laser process. Although an upper limit to the IILD temperature has not yet been determined for AlGaInP, it is clear that 900° C. is viable, and higher temperatures are expected to work well. For similar reasons, the larger phosphorus (and arsenic) content of the IILD films described here are also considered important.

Summarizing the most important aspects of the method of the invention for fabricating improved AlGaInP and AlGaAs heterostructures using IILD:

1. effectiveness of P-doped $Si/Si_3N_4$ films for defect-free IILD;
2. defect-free silicon-IILD of AlGaInP heterostructures;
3. defect-free silicon-IILD of AlGaAs heterostructures, using phosphorus-doped source and barrier films;
4. arsenic- and phosphorus-content greater than 20% for more effective decomposition suppression;
5. temperatures greater than the 900° C. for shorter IILD diffusion times.

The invention is generally applicable to the fabrication of all III-V heterostructure lasers by IILD comprising phosphorus or arsenic superlattices. The composition and thickness of the various layers can be conventional, except where otherwise indicated in the above description. For completeness sake, to assist those skilled in the art in carrying out the invention, the table below lists some representative preferred examples of planar heterostructures fabricated in accordance with the invention, though it is to be understood that the invention is not limited to those examples.

| Layer | Composition | Thickness |
|---|---|---|
| Lower cladding | | |
| 1* | n-AlGaInP | 0.5–1.5 µm |
| 2* | n-GaAlAs | 0.5–1.5 µm |
| Confinement (for total confinement thickness) | | |
| 1 | AlGaInP | 1–500 nm |
| 2 | GaAlAs | 1–500 nm |
| Active | | |
| 1 | GaInP | 2–50 nm |
| 2 | GaAs | 2–50 nm |
| Upper cladding | | |
| 1 | p-AlGaInP | 0.1–1.5 µm |
| 2 | p-GaAlAs | 0.1–1.5 µm |
| Cap | | |
| 1 | p-GaInP | 1–200 nm |
| 2 | p-GaAs | 1–200 nm |

*1 means P-heterostructure; 2 means As-heterostructure

The IILD layers are Si:P or Si:As (with P/As content preferably exceeding 20 atomic %), thickness 1–20 nm, capped by $Si_3N_4$:P or $Si_3N_4$:As (with P/As content preferably exceeding 20%), thickness 10–100 nm, deposited epitaxially in a low-pressure, PECVD reactor. Typical diffusion times to create the intermixed regions are 8–20 h at 900°–1000° C. Following intermixing it is preferred to provide a shallow Zn diffusion to produce a p+ region over the intermixed regions, which are typically n-type due to the Si donors, to avoid leakage currents. Conventional contact metals are applied, and the structure cleaved, front and back, to provide the usual mirrors to form an optical cavity. Where laser arrays are needed, side-by-side lasers are fabricated in a common wafer and suitable isolation provided between adjacent emitting regions to restrict lateral photon and carrier flows.

The resultant planar structure will appear as in FIG. 1, except that the cap layer 16 is preferably constituted of GaInP (FIG. 2A) or superposed layers of GaInP and GaAs (FIG. 2B). When the latter is employed, the GaAs layer thickness preferably does not exceed 100 Å.

Figure 3:
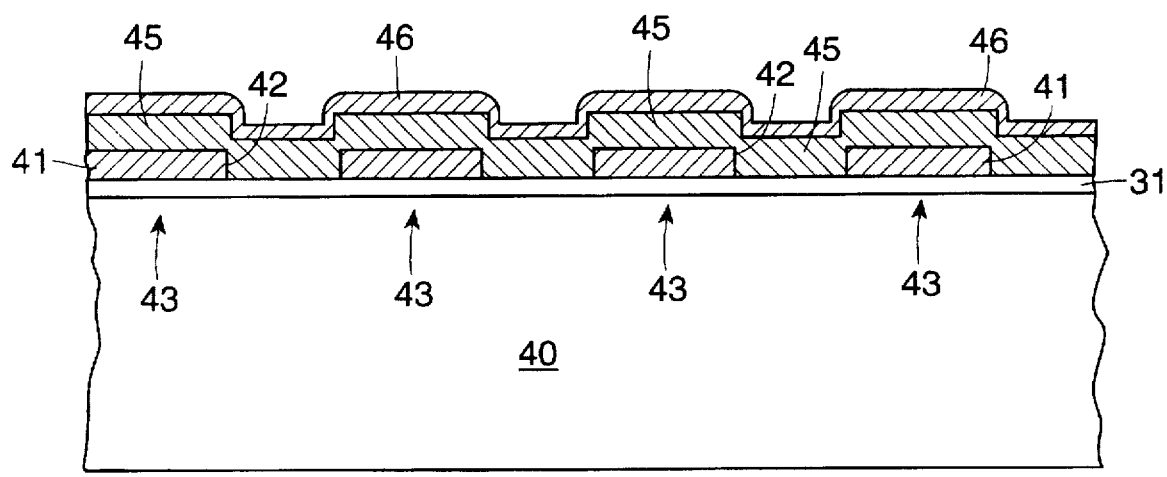
FIG. 3 is a schematic cross-section of a heterostructure prior to carrying out the IILD step.

FIG. 3 illustrates a heterostructure for the fabrication of a laser array at a point in the fabrication process after deposition of the disordering layer but before the actual IILD diffusion step. In FIG. 3, numeral 40 denotes the heterostructure below the cap layer 31 corresponding to the FIG. 2 example. A P-doped silicon nitride layer 41, which acts as a barrier to silicon diffusion, has been deposited and patterned to form windows 42 where the intermixed regions are to be formed. The active laser stripes designated by arrows 43, will ultimately be formed under the masked nitride layer portions 41. Over the patterned nitride are deposited P-doped silicon 45 and silicon nitride 46 films. Following processing. Si diffuses into the heterostructure regions underlying the windows 42 to form the desired intermixed regions.

It will be appreciated that all the layers in the heterostructure 40 including cap layer 31 are epitaxial to the substrate and are generally lattice matched to the substrate, though it may be desirable for certain applications for there to be minor lattice misfits of the thin active layer to the substrate so that it exhibits a desired tensile or compressive stress to control its wavelength and polarization. For the AlGaInP system, lattice matching is generally maintained by using layer compositions in which the indium content is substantially uniform at or near 50%. The nitride and silicon layers are not epitaxial and are probably amorphous, though this is not essential to the invention. Heating to the diffusion temperature or to the pre-anneal temperature can be carried out in a conventional oven, or selectively using known laser heating.

The PECVD reactor is conventional. Reactors for this purpose have been described, for example, in reference [10]. The OMVPE reactor is also conventional and has been described, for example, in reference [11].

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of making an arsenic (As) containing III–V heterostructure employing IILD, comprising the steps:

(a) providing a III–V heterostructure comprising GaAlAs cladding flanking an active layer, (b) selectively depositing on the heterostructure a layer comprising a disordering impurity, As or phosphorus (P), in an amount sufficient to inhibit decomposition of As-containing underlayers, and a barrier material inhibiting out-diffusion of III–V constituents, (c) heating the heterostructure formed in step (b) at an elevated temperature for a time sufficient to cause the disordering impurity to diffuse into the underlying heterostructure regions to form extending below the active region intermixed regions having a lower refractive index than that of adjacent non-intermixed regions, (d) steps (b) and (c) being carried out in such manner as to provide a substantially defect-free As-containing III-V heterostructure.

2. The method of claim 1, wherein step (b) is carried out in a low-pressure PECVD or OMVPE reactor.

3. The method of claim 2, wherein the pressure is between 0.01–10 Torr.

4. The method of claim 2, wherein the As or P content of the layer comprising the disordering impurity exceeds 20%.

5. The method of claim 1, wherein the barrier material is As- or P-doped silicon nitride with an As or P content exceeding 20%.

6. The method of claim 1, wherein step (b) is carried out at a temperature below the congruent sublimation temperature of the GaAlAs in the absence of a phosphorus overpressure.

7. The method of claim 1, wherein step (b) is carried out at a temperature above the congruent sublimation temperature of GaAlAs in the presence of a phosphorus overpressure.

8. A method of making a phosphorus (P) containing III–V heterostructure employing IILD, comprising the steps:

(a) providing a III–V heterostructure comprising GaInP or AlGaInP claddings flanking an active layer, (b) selectively depositing on the heterostructure a layer comprising a disordering impurity, P, in an amount sufficient to inhibit decomposition of P-containing underlayers, and a barrier material inhibiting out-diffusion of III-V constituents, (c) heating the heterostructure formed in step (b) at an elevated temperature for a time sufficient to cause the disordering impurity to diffuse into the underlying heterostructure regions to form extending below the active region intermixed regions having a lower refractive index than that of adjacent non-intermixed regions, (d) steps (b) and (c) being carried out in such manner as to provide a substantially defect-free P-containing III-V heterostructure.

9. The method of claim 8, wherein step (b) is carried out in a low-pressure PECVD or OMVPE reactor.

10. The method of claim 9, wherein the pressure is between 0.01–10 Torr.

11. The method of claim 9, wherein the P content of the layer comprising the disordering impurity exceeds 20%.

12. The method of claim 11, wherein the barrier material is P-doped silicon nitride with an As or P content exceeding 20%.

13. The method of claim 8, wherein step (b) is carried out at a temperature below the congruent sublimation temperature of the GaInP or AlGaInP in the absence of a phosphorus overpressure.

14. The method of claim 8, wherein step (b) is carried out at a temperature above the congruent sublimation temperature of GaInP or AlGaInP in the presence of a phosphorus overpressure.

15. A method of making an arsenic (As) or phosphorus (P) containing III-V heterostructure employing IILD, comprising the steps:

(a) providing a III-V heterostructure comprising GaAlAs or GaInP or AlGaInP claddings flanking an active layer, (b) selectively depositing on the heterostructure a layer comprising a disordering impurity, As or P, in an amount sufficient to inhibit decomposition of As-containing or P-containing underlayers, and a barrier material inhibiting out-diffusion of III-V constituents, (c) pre-annealing the heterostructure formed in step (b) for a time and at a first elevated temperature to remove hydrogen but without cracking and bubbling of the layer formed in step (b), (d) thereafter heating the heterostructure formed in step (b) at a second elevated temperature higher than the first elevated temperature for a time sufficient to cause the disordering impurity to diffuse into the underlying heterostructure regions to form extending below the active region intermixed regions having a lower refractive index than that of adjacent non-intermixed regions, (e) steps (b) and (c) being carried out in such manner as to provide a substantially defect-free As-containing III-V heterostructure.

16. The method of claim 15, wherein step (b) is carried out in a low-pressure PECVD or OMVPE reactor.

17. The method of claim 16, wherein the first elevated temperature is in the range of 400°–600° C.

18. The method of claim 16, wherein the second elevated temperature is in the range of 600°–1100° C.

19. The method of claim 15, wherein step (b) is carried out in a phosphorus overpressure.

20. The method of claim 15, wherein step (b) is carried out at a low pressure of 0.1–10 Torr.

* * * * *